(12) United States Patent
Ramdani

(10) Patent No.: US 8,723,296 B2
(45) Date of Patent: May 13, 2014

(54) STRESS COMPENSATION FOR LARGE AREA GALLIUM NITRIDE OR OTHER NITRIDE-BASED STRUCTURES ON SEMICONDUCTOR SUBSTRATES

(75) Inventor: Jamal Ramdani, Scarborough, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 439 days.

(21) Appl. No.: 12/927,947

(22) Filed: Nov. 30, 2010

(65) Prior Publication Data

US 2011/0140242 A1 Jun. 16, 2011

Related U.S. Application Data

(60) Provisional application No. 61/284,312, filed on Dec. 16, 2009.

(51) Int. Cl.
*H01L 29/66* (2006.01)
*H01L 21/20* (2006.01)

(52) U.S. Cl.
USPC .... 257/615; 257/194; 257/347; 257/E21.561; 257/478; 257/192; 438/299; 438/400; 438/413; 438/459; 438/479

(58) Field of Classification Search
USPC .......... 257/194, 347, E21.561; 438/299, 400, 438/413, 459, 479
See application file for complete search history.

(56) References Cited

U.S. PATENT DOCUMENTS 4,400,411 A * 8/1983 Yuan et al. .................... 438/400
4,507,158 A * 3/1985 Kamins et al. ................ 438/413
(Continued)

FOREIGN PATENT DOCUMENTS

EP 1 280 190 A1 1/2003
WO WO 2009/015350 A1 1/2009

OTHER PUBLICATIONS

Notification of Transmittal of the International Search Report and the Written Opinion of the International Searching Authority, or the Declaration dated Jun. 27, 2011 in connection with International Patent Application No. PCT/US2010/058296.

(Continued)

*Primary Examiner* — Lex Malsawma
*Assistant Examiner* — Sheng Zhu
(74) *Attorney, Agent, or Firm* — Jaqueline J. Garner; Wade J. Brady, III; Frederick J. Telecky, Jr.

(57) ABSTRACT

A method includes forming a stress compensating stack over a substrate, where the stress compensating stack has compressive stress on the substrate. The method also includes forming one or more Group III-nitride islands over the substrate, where the one or more Group III-nitride islands have tensile stress on the substrate. The method further includes at least partially counteracting the tensile stress from the one or more Group III-nitride islands using the compressive stress from the stress compensating stack. Forming the stress compensating stack could include forming one or more oxide layers and one or more nitride layers over the substrate. The one or more oxide layers can have compressive stress, the one or more nitride layers can have tensile stress, and the oxide and nitride layers could collectively have compressive stress. Thicknesses of the oxide and nitride layers can be selected to provide the desired amount of stress compensation.

17 Claims, 3 Drawing Sheets

(56) References Cited

U.S. PATENT DOCUMENTS

| | | | |
|---|---|---|---|
| 5,239,188 | A | 8/1993 | Takeuchi et al. |
| 6,168,659 | B1 | 1/2001 | Yuri et al. |
| 6,274,444 | B1 * | 8/2001 | Wang .................. 438/299 |
| 6,649,287 | B2 | 11/2003 | Weeks, Jr. et al. |
| 7,294,200 | B2 | 11/2007 | Fujikura et al. |
| 7,301,205 | B2 | 11/2007 | Matsumori |
| 7,312,134 | B2 * | 12/2007 | Chidambarrao et al. ..... 438/459 |
| 7,329,923 | B2 * | 2/2008 | Doris et al. .................. 257/347 |
| 7,374,618 | B2 | 5/2008 | Yoshida |
| 7,598,108 | B2 | 10/2009 | Li et al. |
| 2003/0087462 | A1 | 5/2003 | Koide et al. |
| 2004/0063300 | A1 | 4/2004 | Chi |
| 2005/0124143 | A1 | 6/2005 | Roycroft et al. |
| 2005/0285150 | A1 | 12/2005 | Birner et al. |
| 2006/0118823 | A1 * | 6/2006 | Parikh et al. ................... 257/194 |
| 2007/0105274 | A1 | 5/2007 | Fitzgerald |
| 2007/0105335 | A1 | 5/2007 | Fitzgerald |
| 2007/0155121 | A1 | 7/2007 | Frohberg et al. |
| 2007/0298592 | A1 * | 12/2007 | Chyi et al. ..................... 438/479 |
| 2008/0296625 | A1 | 12/2008 | Li et al. |
| 2009/0085166 | A1 | 4/2009 | Iwamuro |

OTHER PUBLICATIONS

European Search Report dated Dec. 22, 2011 in connection with European Patent Application No. EP 11 17 8555.
Sandeep R. Bahl, et al., "Growth of Group III Nitride-Based Structures and Integration With Conventional CMOS Processing Tools", U.S. Appl. No. 12/800,606, filed May 19, 2010.
Sandeep R. Bahl, et al., "Growth of Multi-Layer Group III-Nitride Buffers on Large-Area Silicon Substrates and Other Substrates", U.S. Appl. No. 12/807,336, filed Sep. 2, 2010.
A. Able, et al., "Growth of crack-free GaN on Si(1 1 1) with graded AlGaN buffer layers", Journal of Crystal Growth, 276, Jan. 22, 2005, p. 415-418.
R. Liu, et al., "Atomic arrangement at the AlN/Si (111) interface", Applied Physics Letters, vol. 83, No. 5, Aug. 4, 2003, p. 860-862.
"GaN Essentials, AN-011: Substrates for GaN RF Devices", Nitronex Corporation, Jun. 2008, 10 pages.
Abdalla Naem, et al., "Method for Forming High-Quality Gallium Nitride Structures on Silicon or Other Substrates and Related Apparatus", U.S. Appl. No. 12/577,576, filed Oct. 12, 2009.
H. Miyake, et al., "Growth of crack-free AlGaN on selective-area-growth GaN", Journal of Crystal Growth 310, Aug. 22, 2008, p. 4885-4887.

* cited by examiner

US 8,723,296 B2

STRESS COMPENSATION FOR LARGE AREA GALLIUM NITRIDE OR OTHER NITRIDE-BASED STRUCTURES ON SEMICONDUCTOR SUBSTRATES

CROSS-REFERENCE TO RELATED APPLICATION AND PRIORITY CLAIM

This application claims priority under 35 U.S.C. §119(e) to U.S. Provisional Patent Application No. 61/284,312 filed on Dec. 16, 2009, which is hereby incorporated by reference.

TECHNICAL FIELD

This disclosure relates generally to semiconductor devices. More specifically, this disclosure relates to stress compensation for large area gallium nitride or other nitride-based structures on semiconductor substrates.

BACKGROUND

Various Group III-V compounds are being investigated for use in high-power electronics applications. These compounds include "Group III-nitrides" such as gallium nitride (GaN), aluminum gallium nitride (AlGaN), and aluminum indium gallium nitride (AlInGaN). These compounds are often fabricated by epitaxial growth on substrates such as silicon, sapphire, and silicon carbide. The use of silicon substrates is often preferred due to its lower fabrication costs. Also, silicon substrates are suitable for monolithic integration with other silicon-based devices, such as CMOS and BiCMOS devices.

One problem is that epitaxial growth of Group III-nitrides on silicon <111> substrates often results in large lattice and thermal coefficient mismatches. Lattice mismatch can cause concave bending of the epitaxial layers and substrates, along with large threading dislocation density formations. When the thickness of an epitaxial layer exceeds a critical value, cracking and delimination can also occur. High thermal mismatch between the epitaxial layers and substrates can create tensile stress during cooling, which can cause additional cracking and delimination. As an example, gallium nitride films grown by Metal-Organic Chemical Vapor Deposition (MOCVD) are often subject to about 1 GPa tensile stress per micron of gallium nitride.

The cracking and delimination that occur can vary based on the diameter of a silicon substrate, a thickness of the silicon substrate, and a thickness of the epitaxial layer. For smaller-diameter silicon substrates (such as three-inch and four-inch diameter wafers), the maximum epitaxial layer thickness that can be achieved without cracks is often around 2.5 µm-3 µm. For larger-diameter silicon substrates (such as six-inch diameter wafers or larger), the maximum epitaxial layer thickness that can be achieved without cracks is typically 1 µm-2 µm for substrate thicknesses of about 650 µm-700 µm. Power devices with high breakdown voltages (such as more than 1,000V) often require epitaxial layer thicknesses in excess of 3.5 µm, which typically cannot be achieved with larger silicon substrates using current methods.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 4, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

In general, this disclosure describes a technique for forming Group III-nitride epitaxial or other layers on semiconductor substrates, such as silicon or silicon-on-insulator (SOI) substrates. A "Group III-nitride" refers to a compound formed using nitrogen and at least one Group III element. Example Group III elements include indium, gallium, and aluminum. Example Group III-nitrides include gallium nitride (GaN), aluminum gallium nitride (AlGaN), indium aluminum nitride (InAlN), indium aluminum gallium nitride (InAlGaN), aluminum nitride (AlN), indium nitride (InN), and indium gallium nitride (InGaN). Stress compensation can be achieved using a stack of oxide and nitride layers on a substrate, such as a stack of silicon dioxide ($SiO_2$) and silicon nitride ($Si_3N_4$) layers. As particular examples, this technique can be used to form gallium nitride, aluminum gallium nitride, indium aluminum gallium nitride, or other Group III-nitride epitaxial layers on six-inch, eight-inch, twelve-inch, or larger silicon or SOI wafers.

Figure 1:
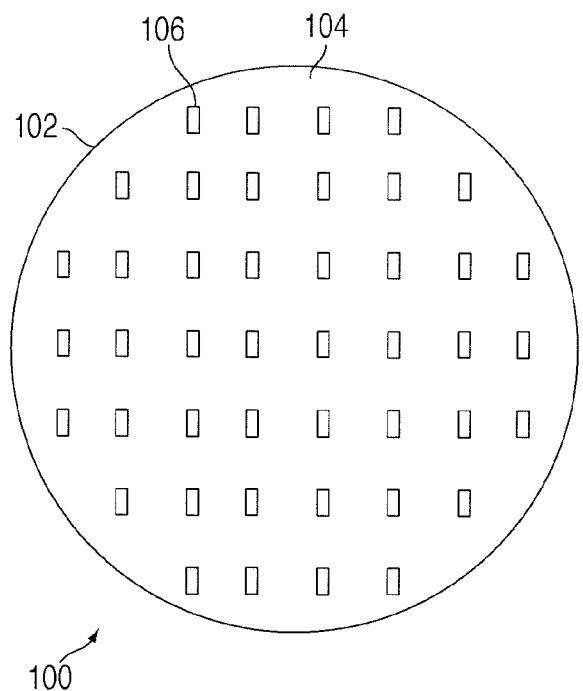
FIG. 1 illustrates an example semiconductor structure for Group III-nitride devices having Group III-nitride islands according to this disclosure.

FIG. 1 illustrates an example semiconductor structure 100 for Group III-nitride devices having Group III-nitride islands according to this disclosure. In this example, the semiconductor structure 100 includes a semiconductor substrate 102, which represents any suitable substrate on which other layers or structures are formed. For example, the semiconductor substrate 102 could represent a silicon <111> substrate or an SOI <111> substrate (with silicon <111> as the top layer and silicon <100> as the handle substrate). The semiconductor substrate 102 could also represent a sapphire, silicon carbide, or other semiconductor substrate. The semiconductor substrate 102 could have any suitable size, such as a three-inch, four-inch, six-inch, eight-inch, twelve-inch, or other diameter.

A stack 104 of oxide and nitride layers is formed over the semiconductor substrate 102. Any suitable oxide and nitride materials could be used in the stack 104, such as silicon dioxide and silicon nitride. The stack 104 could include any number of oxide and nitride layers in any suitable arrangement or pattern. The stack 104 could also be formed in any suitable manner, such as by using physical vapor deposition (PVD), chemical vapor deposition (CVD), or plasma-enhanced CVD (PECVD).

One or more Group III-nitride islands 106 are also formed over the substrate 102. Depending on the fabrication process, the Group III-nitride islands 106 could be formed within the stack 104, or the stack 104 could be formed around the Group III-nitride islands 106. The Group III-nitride islands 106 generally represent areas where at least one Group III-nitride material has been selectively or non-selectively grown or otherwise formed. The Group III-nitride islands 106 could include any suitable material(s), such as gallium nitride or aluminum gallium nitride. In some embodiments, the Group III-nitride islands 106 could include one or multiple epitaxial layers of Group III-nitride material(s). The Group III-nitride islands 106 could also be formed in any suitable manner, such as by using a Metal-Organic Chemical Vapor Deposition (MOCVD) or Molecular. Beam Epitaxy (MBE) technique. The Group III-nitride islands 106 could be formed before or after the stack 104 is formed. In particular embodiments, the stack 104 can be patterned and etched prior to formation of the islands 106.

Power transistors or other devices can be fabricated using the Group III-nitride islands 106. As particular examples, power devices like Group III-nitride field effect transistors (FET) or high electron mobility transistors (HEMT) could be formed using the islands 106.

Ordinarily, a Group III-nitride epitaxial layer is under tensile stress. The amount of tensile stress could vary based on, for example, the density and the size of the islands 106. The density of the islands 106 could determine the effective strain, and the size of the islands 106 could be based on the effective area needed for the power devices being formed.

The stack 104 in FIG. 1 is used to provide strain compensation. More specifically, the oxide and nitride layers in the stack 104 are used to collectively provide compressive stress in order to help relieve the tensile stress produced by the islands 106. In this example embodiment, the stack 104 could have layers of compressive oxide (such as $SiO_2$) and tensile nitride (such as $Si_3N_4$). Characteristics of the stack 104 can be selected to provide the desired stress compensation. For instance, the thicknesses of the oxide and nitride layers in the stack 104 can be selected to provide a desired amount of compressive stress, which helps to counteract the tensile stress produced by the islands 106.

In this way, the addition of a compressive stack 104 can accommodate the Group III-nitride tensile stress, such as when $SiO_2/Si_3N_4$ layers in the stack 104 are prepared with compressive stress in the range of 0.5-2.5 GPa. In particular embodiments, the stack layers' overall compressive stress may be near or equal in absolute value to the tensile stress generated by the Group III-nitride material's growth and cooling per micron of Group III-nitride material. This can help to reduce or minimize wafer bow, allowing the Group III-nitride thickness to be increased up to and over 3.5 μm with reduced or no cracks. This in turn can reduce or minimize threading dislocation density and can result in epitaxial films with higher quality and higher device performances (such as higher breakdown voltages and drive currents). In addition, the yield on wafer level preparation can be higher, thus lowering the manufacturing costs of these power devices. When this technique is used with substrates such as silicon <111> or SOI substrates, the monolithic integration of Group III-nitride devices and silicon <100>-based devices or other silicon-based devices is feasible.

Although FIG. 1 illustrates one example of a semiconductor structure 100 for Group III-nitride devices having Group III-nitride islands, various changes may be made to FIG. 1. For example, the substrate 102 could have any suitable size, shape, and composition. Also, any number of Group III-nitride islands could be formed in the substrate 102 in any suitable arrangement. For instance, the number and arrangement of the Group III-nitride islands could vary based on where Group III-nitride devices need to be formed in the structure. Further, while specific materials and manufacturing processes are described above, any other materials and manufacturing processes could be used to form various layers or other components of the semiconductor structure 100. In addition, while specific shapes or relative sizes are shown in FIG. 1, each component of the semiconductor structure 100 could have any suitable size, shape, and dimensions.

Figure 2:
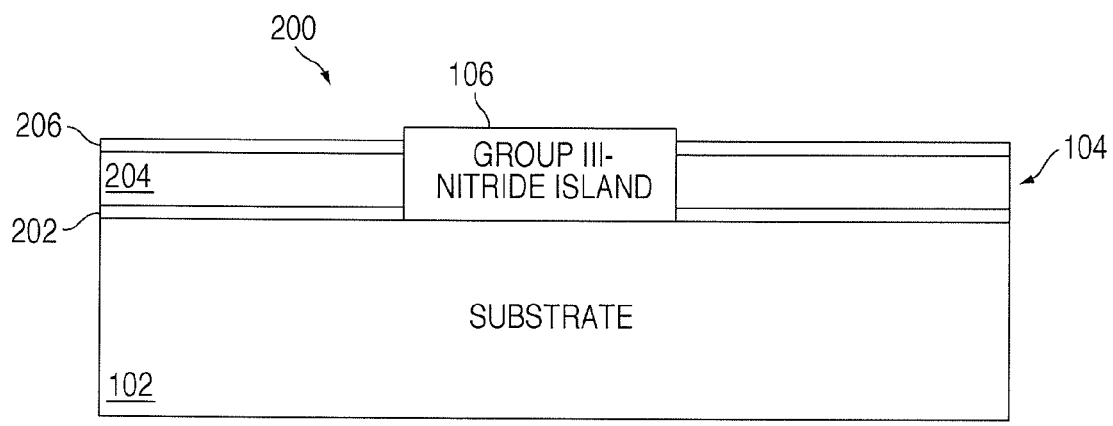
FIG. 2 illustrates a cross-section of an example semiconductor structure for Group III-nitride devices having Group III-nitride islands according to this disclosure.

FIG. 2 illustrates a cross-section 200 of an example semiconductor structure for Group III-nitride devices having Group III-nitride islands according to this disclosure. In this example, the semiconductor structure includes the substrate 102 (such as a silicon or SOI wafer), the stress compensation stack 104, and a Group III-nitride island 106 (such as a gallium nitride or aluminum gallium nitride island).

The stress compensation stack 104 includes a lower oxide layer 202, a nitride layer 204, and an upper oxide layer 206. The oxide layers 202 and 206 could include any suitable oxide material(s), such as silicon dioxide. The nitride layer 204 could include any suitable nitride material(s), such as silicon nitride. The layers 202-206 in the stack 104 can be formed in any suitable manner, such as by using PVD, CVD, or PECVD. The layers 202-206 in the stack 104 collectively have compressive stress that substantially or completely compensates for the tensile stress of one or more Group III-nitride islands 106.

The Group III-nitride island 106 could be formed in any suitable manner. For instance, the Group III-nitride island 106 could be formed using selective epitaxial growth of at least one Group III-nitride. Note that selective epitaxial growth of the Group III-nitride material(s) forming the island(s) 106 can reduce the effective tensile stress on the substrate 102. However, the Group III-nitride material(s) could also be formed non-selectively, such as by depositing the material and then polishing, etching, or otherwise removing the excess material to form the islands 106.

Although FIG. 2 illustrates a cross-section 200 of one example of a semiconductor structure for Group III-nitride devices having Group III-nitride islands, various changes may be made to FIG. 2. For example, while specific materials and manufacturing processes are described above, any other materials and manufacturing processes could be used to form various layers or other components of the semiconductor structure. Also, while specific shapes or relative sizes are shown in FIG. 2, each component of the semiconductor structure could have any suitable size, shape, and dimensions.

Figure 3A:
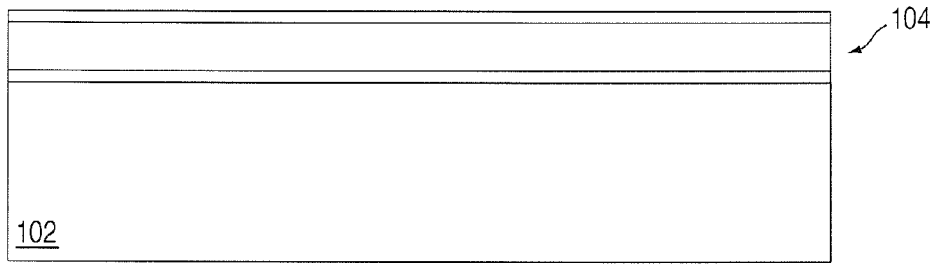
FIGS. 3A through 3D illustrate an example technique for forming a semiconductor structure having Group III-nitride islands according to this disclosure.

FIGS. 3A through 3D illustrate an example technique for forming a semiconductor structure having Group III-nitride islands according to this disclosure. As shown in FIG. 3A, an oxide/nitride stack 104 is formed over a substrate 102. The oxide/nitride stack 104 could include any number of oxide layers and any number of nitride layers. The thicknesses of the oxide and nitride layers could be selected based on the amount of stress relief required. For example, if more Group III-nitride islands are being formed closer together, the stack 104 may be modified to produce a larger amount of compressive stress. If fewer Group III-nitride islands are being formed farther apart, the stack 104 may be modified to produce a smaller amount of compressive stress. In some embodiments, the stack 104 can be designed based on factors such as the number of Group III-nitride islands 106 to be formed, a distance between neighboring Group III-nitride islands 106, or a ratio of an area of the Group III-nitride islands 106 to a total area of the substrate 102.

Figure 3B:
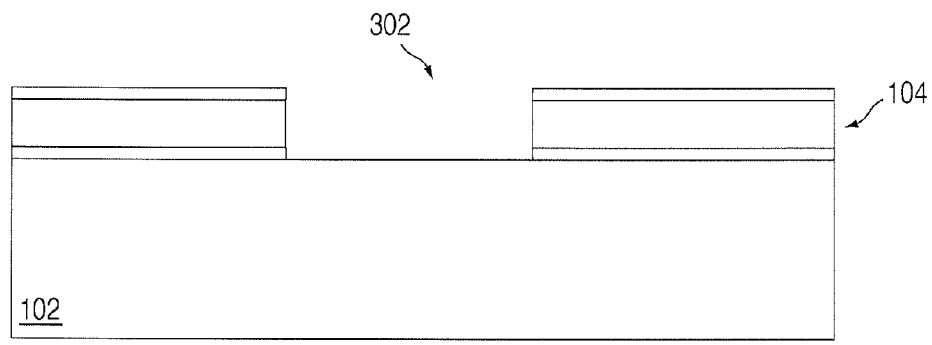

As shown in FIG. 3B, the stack 104 is etched or otherwise processed to form at least one opening 302. Each opening 302 could have any suitable size and shape, and multiple openings 302 could have different sizes or shapes. The openings 302 could be formed in any suitable manner. For example, the openings 302 could be formed by depositing a layer of photoresist material over the stack 104 and patterning the photoresist material to create openings through the photoresist material. An etch could then be performed to etch the stack 104 through the openings in the photoresist material.

Note, however, that any other suitable technique could be used to form a stack 104 with at least one opening 302. For instance, the oxide and nitride layers of the stack 104 could be formed in selective areas while leaving other areas free of oxide and nitride materials. As a specific example, one or more layers of photoresist material could be formed on the substrate 102 and patterned to the desired shape of the stack 104. The oxide and nitride layers of the stack 104 could be deposited, and the photoresist material can be removed. This process could create a stack 104 having one or more openings 302.

Figure 3C:
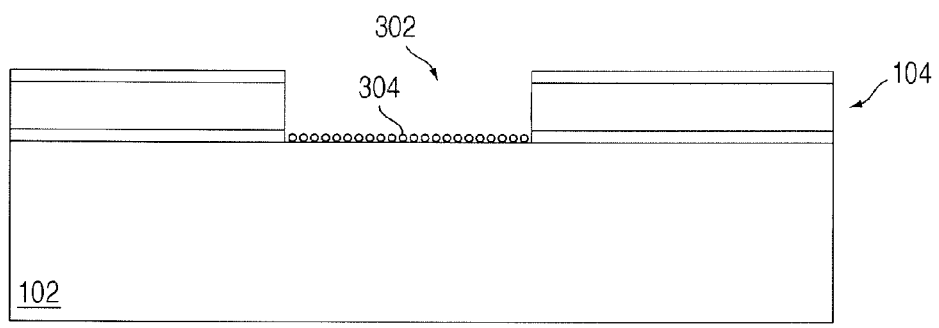
Figure 3D:
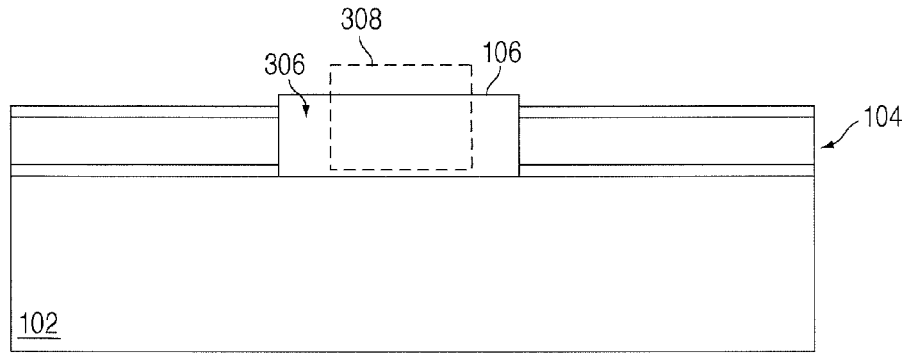

However the openings 302 are formed, one or more Group III-nitride islands could be formed in the openings 302 of the stack 104. In some embodiments, the selective growth of one or more Group III-nitride epitaxial layers is used. This could be accomplished, for example, by forming a nucleation layer 304 within the opening 302 as shown in FIG. 3C. The nucleation layer 304 could be formed from any suitable material(s) and in any suitable manner. For instance, the nucleation layer 304 could be formed by a low-temperature aluminum nitride layer, which could have a thickness of several nanometers up to 100 nm. As shown in FIG. 3D, one or more Group III-nitride materials 306 are then deposited within the opening 302 (as possibly above and around the opening 302). The Group III-nitride materials 306 are grown selectively using the nucleation layer 304. The Group III-nitride materials 306 could be formed in any suitable manner, such as by using MOCVD or MBE. At this point, the Group III-nitride materials 306 could be further processed (such as planarized using polishing or etching) to complete formation of at least one Group III-nitride island 106.

This represents one example way of forming the Group III-nitride island 106, which specifically involves the use of selective growth of epitaxial Group III-nitride material(s) 306. However, other embodiments could also be used. For instance, the Group III-nitride material(s) 306 could be deposited non-selectively and then etched to form the islands 306. Note, however, that this may create larger tensile stress on the substrate 102 between the time that an epitaxial layer is formed and the time that the epitaxial layer is etched to form the islands 106. The stack 104 could therefore be designed to produce enough counteracting stress before the epitaxial layer is etched, without producing excessive stress that would create problems after the epitaxial layer is etched.

At this point, at least one integrated circuit element 308 can be fabricated using the structure as shown in FIG. 3D. The integrated circuit element 308 could include any suitable structures used to form one or more power devices. For instance, the element 308 could include components forming a Group III-nitride FET or HEMT. Note that any suitable number(s) and type(s) of Group III-nitride devices or other devices could be fabricated using the structure manufactured as shown in FIGS. 3A through 3D.

Although FIGS. 3A through 3D illustrate one example of a technique for forming a semiconductor structure having Group III-nitride islands, various changes may be made to FIGS. 3A through 3D. For example, as noted above, various techniques could be used to fabricate each of the components shown in FIGS. 3A through 3D.

Figure 4:
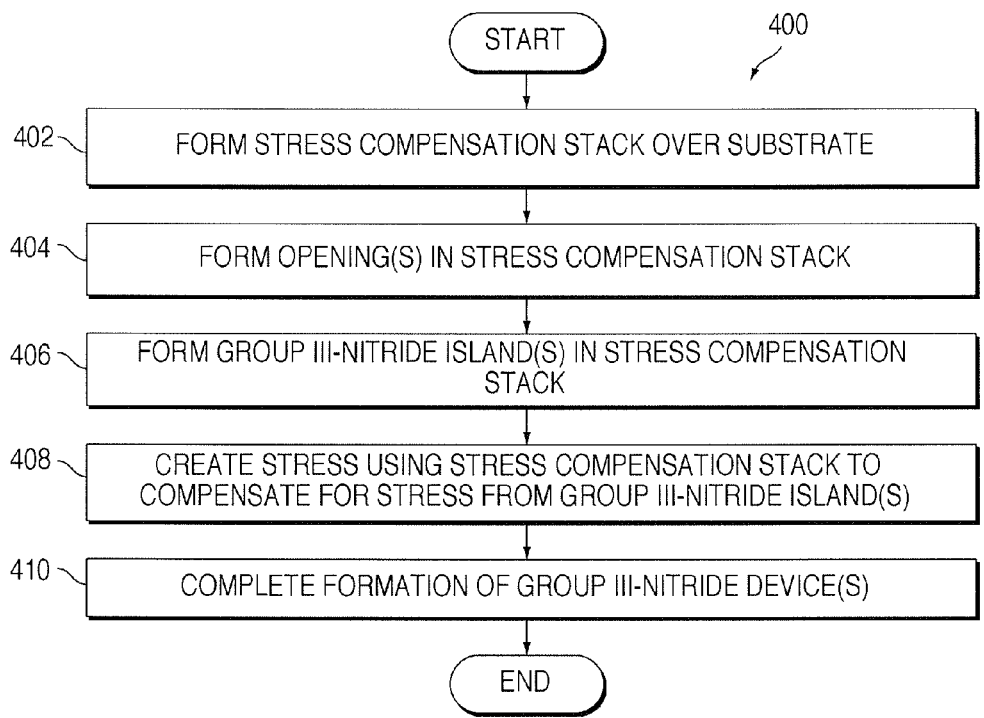
FIG. 4 illustrates an example method for forming a semiconductor structure having Group III-nitride islands for Group III-nitride devices according to this disclosure.

FIG. 4 illustrates an example method 400 for forming a semiconductor structure having Group III-nitride islands for Group III-nitride devices according to this disclosure. As shown in FIG. 4, a stress compensation stack is formed over a semiconductor substrate at step 402. This could include, for example, forming an oxide/nitride stack 104 over a substrate 102. Note, however, that the stress compensation stack 104 could be formed from any other suitable material(s). One or more openings are formed in the stress compensation stack at step 404. This could include, for example, patterning and etching the stack 104 to create the opening(s) 302. Note, however, that any other suitable technique could be used to form a stress compensation stack 104 having one or more openings 302.

One or more Group III-nitride islands are formed in the stress compensation stack at step 406. This could include, for example, forming the Group III-nitride island(s) 106 using selective or non-selective epitaxial growth. At least one Group III-nitride material is used in the formation of the Group III-nitride islands 106, and one or multiple layers of Group III-nitride material could be used. Stress is created using the stress compensation stack in order to compensate for stress from the one or more Group III-nitride islands at step 408. This could include, for example, using compressive stress from the stress compensation stack 104 to reduce or cancel tensile stress from the Group III-nitride islands 106.

At this point, formation of one or more Group III-nitride devices could be completed at step 410. This could include, for example, forming sources, drains, and gates of one or more Group III-nitride FETs or HEMTs using the substrate structure. Of course, any other Group III-nitride device(s) could be formed using the Group III-nitride islands 106.

Although FIG. 4 illustrates one example of a method 400 for forming a semiconductor structure having Group III-nitride islands for Group III-nitride devices, various changes may be made to FIG. 4. For example, while shown as a series of steps, various steps in FIG. 4 could overlap, occur in parallel, or occur in a different order. As a particular example, any other combination of steps to produce a stress compensation stack having one or more islands of Group III-nitride material(s) could be used.

It may be advantageous to set forth definitions of certain words and phrases that have been used within this patent document. The terms "include" and "comprise," as well as derivatives thereof, mean inclusion without limitation. The term "or" is inclusive, meaning and/or.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   forming one or more Group III-nitride islands over a substrate, the one or more Group III-nitride islands having tensile stress on the substrate;
   forming a stress compensating stack over the substrate, the stress compensating stack having compressive stress on the substrate; and
   at least partially counteracting the tensile stress from the one or more Group III-nitride islands using the compressive stress from the stress compensating stack, wherein:
   forming the stress compensating stack comprises forming one or more oxide layers and one or more nitride layers over the substrate;

the one or more oxide layers have compressive stress;
the one or more nitride layers have tensile stress; and
the oxide and nitride layers collectively have compressive stress.

2. The method of claim 1, wherein thicknesses of the oxide and nitride layers are selected based on at least one of:
a number of Group III-nitride islands;
a distance between neighboring Group III-nitride islands; and
a ratio of an area of the Group III-nitride islands to a total area of the substrate.

3. The method of claim 1, further comprising:
forming one or more openings in the stress compensating stack;
wherein forming the one or more Group III-nitride islands comprises forming the one or more Group III-nitride islands within the one or more openings in the stress compensating stack.

4. The method of claim 3, wherein forming the one or more Group III-nitride islands within the one or more openings comprises selectively forming the one or more Group III-nitride islands within the one or more openings.

5. The method of claim 1, wherein forming the one or more Group III-nitride islands comprises forming a Group III-nitride epitaxial layer.

6. The method of claim 5, wherein the Group III-nitride epitaxial layer comprises at least one of: gallium nitride, aluminum gallium nitride, indium aluminum nitride, indium aluminum gallium nitride, aluminum nitride, indium nitride, and indium gallium nitride.

7. The method of claim 1, wherein each of the one or more Group III-nitride islands has a thickness greater than 3.5 pm.

8. An apparatus comprising:
a substrate;
a stress compensating stack over the substrate, the stress compensating stack having compressive stress on the substrate;
one or more Group III-nitride islands over the substrate and within the stress compensating stack, the one or more Group III nitride islands having tensile stress on the substrate;
wherein the apparatus is configured so that the compressive stress from the stress compensating stack at least partially counteracts the tensile stress from the one or more Group III nitride islands; and
wherein:
the stress compensating stack comprises one or more oxide layers and one or more nitride layers;
the one or more oxide layers have compressive stress;
the one or more nitride layers have tensile stress; and
the oxide and nitride layers collectively have compressive stress.

9. The apparatus of claim 8, wherein thicknesses of the oxide and nitride layers are selected based on at least one of:
a number of Group III-nitride islands;
a distance between neighboring Group III-nitride islands; and
a ratio of an area of the Group III-nitride islands to a total area of the substrate.

10. The apparatus of claim 8, wherein:
the one or more oxide layers comprise silicon dioxide; and
the one or more nitride layers comprise silicon nitride.

11. The apparatus of claim 8, wherein the one or more Group III-nitride islands comprise a selective Group III-nitride epitaxial layer.

12. The apparatus of claim 11, wherein the Group III-nitride epitaxial layer comprises at least one of: gallium nitride, aluminum gallium nitride, indium aluminum nitride, indium aluminum gallium nitride, aluminum nitride, indium nitride, and indium gallium nitride.

13. The apparatus of claim 8, wherein each of the one or more Group III-nitride islands has a thickness greater than 3.5 m.

14. A system comprising:
a semiconductor structure comprising:
a stress compensating stack over a substrate, the stress compensating stack having compressive stress on the substrate;
one or more Group III-nitride islands over the substrate and within the stress compensating stack, the one or more Group III-nitride islands having tensile stress on the substrate; and
one or more Group III-nitride integrated circuit devices in or over the one or more Group III-nitride islands;
wherein the semiconductor structure is configured so that the compressive stress from the stress compensating stack at least partially counteracts the tensile stress from the one or more Group III-nitride islands; and
wherein:
the stress compensating stack comprises one or more oxide layers and one or more nitride layers;
the one or more oxide layers have compressive stress;
the one or more nitride layers have tensile stress; and
the oxide and nitride layers collectively have compressive stress.

15. The system of claim 14, wherein the one or more Group III-nitride islands comprise a selective Group III-nitride epitaxial layer.

16. The system of claim 14, wherein each of the one or more Group III-nitride islands has a thickness greater than 3.5 m.

17. The system of claim 14, wherein the one or more Group III-nitride integrated circuit devices comprise at least one of: a Group III-nitride field effect transistor (FET) and a Group III nitride high electron mobility transistor (HEMT).

* * * * *